United States Patent
Wu et al.

(10) Patent No.: US 10,468,486 B2
(45) Date of Patent: Nov. 5, 2019

(54) SOI SUBSTRATE, SEMICONDUCTOR DEVICE AND METHOD FOR MANUFACTURING THE SAME

(71) Applicant: TAIWAN SEMICONDUCTOR MANUFACTURING COMPANY LTD, Hsinchu (TW)

(72) Inventors: Cheng-Ta Wu, Chiayi County (TW); Kuo-Hwa Tzeng, Taipei (TW); Chih-Hao Wang, Hsinchu County (TW); Yeur-Luen Tu, Taichung (TW); Chung-Yi Yu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/861,464

(22) Filed: Jan. 3, 2018

(65) Prior Publication Data
US 2019/0131400 A1    May 2, 2019

Related U.S. Application Data

(60) Provisional application No. 62/579,054, filed on Oct. 30, 2017.

(51) Int. Cl.
*H01L 29/08* (2006.01)
*H01L 21/762* (2006.01)
*H01L 21/84* (2006.01)
*H01L 29/06* (2006.01)
*H01L 27/12* (2006.01)

(52) U.S. Cl.
CPC ...... *H01L 29/0847* (2013.01); *H01L 21/7624* (2013.01); *H01L 21/84* (2013.01); *H01L 27/1203* (2013.01); *H01L 29/0649* (2013.01)

(58) Field of Classification Search
CPC ............. H01L 29/0847; H01L 27/1203; H01L 21/7624; H01L 29/0649
See application file for complete search history.

(56) References Cited

U.S. PATENT DOCUMENTS

2015/0115480 A1* 4/2015 Peidous ............ H01L 21/76251
257/798

\* cited by examiner

*Primary Examiner* — Sonya D. McCall-Shepard
(74) *Attorney, Agent, or Firm* — WPAT, P.C., Intellectual Property Attorneys; Anthony King

(57) ABSTRACT

A silicon-on-insulator (SOI) substrate includes a semiconductor substrate and a multi-layered polycrystalline silicon structure. The multi-layered polycrystalline silicon structure is disposed over the semiconductor substrate. The multi-layered polycrystalline silicon structure includes a plurality of polycrystalline silicon layers stacked over one another, and a native oxide layer between each adjacent pair of polycrystalline silicon layers.

20 Claims, 10 Drawing Sheets

SOI SUBSTRATE, SEMICONDUCTOR DEVICE AND METHOD FOR MANUFACTURING THE SAME

PRIORITY CLAIM AND CROSS-REFERENCE

This application claims priority of U.S. provisional application Ser. No. 62/579,054 filed on Oct. 30, 2017, which is incorporated by reference in its entirety.

BACKGROUND

Semiconductor dies are fabricated on a semiconductor substrate by various manufacturing operations such as deposition, photolithography, etching, implantation or the like. In recent years, silicon-on-insulator (SOI) substrate has been developed as as an alternative substrate. The SOI substrate is a substrate which has a device silicon layer separated from an underlying handle silicon wafer by an insulative layer. The SOI substrate has advantages such as reduced parasitic capacitances, reduced power consumption, reduced current leakage and increased ability to operate at more elevated temperature.

The handle silicon wafer has high resistivity, which allows to meet some application requirements such as device-to-device isolation, passive device Q-factors, etc. Due to the low dopant of the handle silicon wafer, carriers tend to accumulate adjacent to the interface between the handle silicon wafer and the insulative layer. The voltage applied to the overlying device may interact with the accumulated carriers, deteriorating performance of the overlying device. In some application such as RF application, the RF signals may suffer from cross-talk and non-linear distortion.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
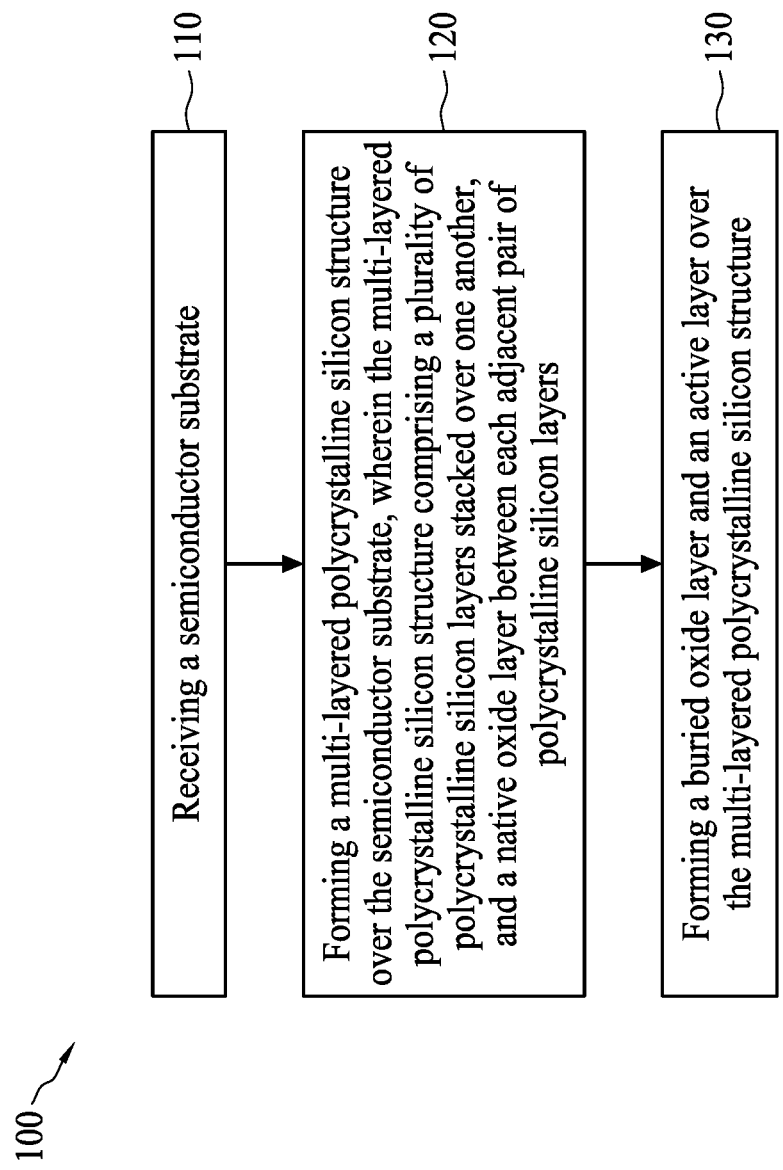
FIG. 1 is a flow chart illustrating a method for manufacturing a silicon-on-insulator (SOI) substrate according to various aspects of one or more embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "above", "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

In one or more embodiments of the present disclosure, a composite substrate with a multi-layered trap-rich structure including a plurality of trap-rich layers and one or more barrier layer is provided. In some embodiments, the composite substrate may include a silicon-on-insulator (SOI) substrate; the trap-rich layers may include polycrystalline silicon layers; and the one or more barrier layer may include a silicon oxide layer. The trap-rich layers of the multi-layered trap-rich structure include crystal defects having dislocations to trap carriers in a semiconductor substrate. By trapping the carriers within the crystal defects of the multi-layered trap-rich structure, parasitic surface conduction which may result in non-linear distortion to RF signals may be mitigated. The barrier layer of the multi-layered trap-rich structure may block the grains of the trap-rich layers from abutting each other, and thus may help to inhibit regrowth of the grains. By virtue of the barrier layer, the grains of the trap-rich layers may be controlled to have smaller grain size and fine grain structure, and thus the trap density of the multi-layered trap-rich structure can be increased.

FIG. 1 is a flow chart illustrating a method for manufacturing a silicon-on-insulator (SOI) substrate according to various aspects of one or more embodiments of the present disclosure. The method 100 begins with operation 110 in which a semiconductor substrate is received. The method 100 proceeds with operation 120 in which a multi-layered polycrystalline silicon structure is formed over the semiconductor substrate. The multi-layered polycrystalline silicon structure may include a plurality of polycrystalline silicon layers stacked over one another, and a native oxide layer between each adjacent pair of the polycrystalline silicon layers. The method 100 continues with operation 130 in which a buried oxide layer and an active layer are formed over the multi-layered polycrystalline silicon structure.

The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

Figure 2:
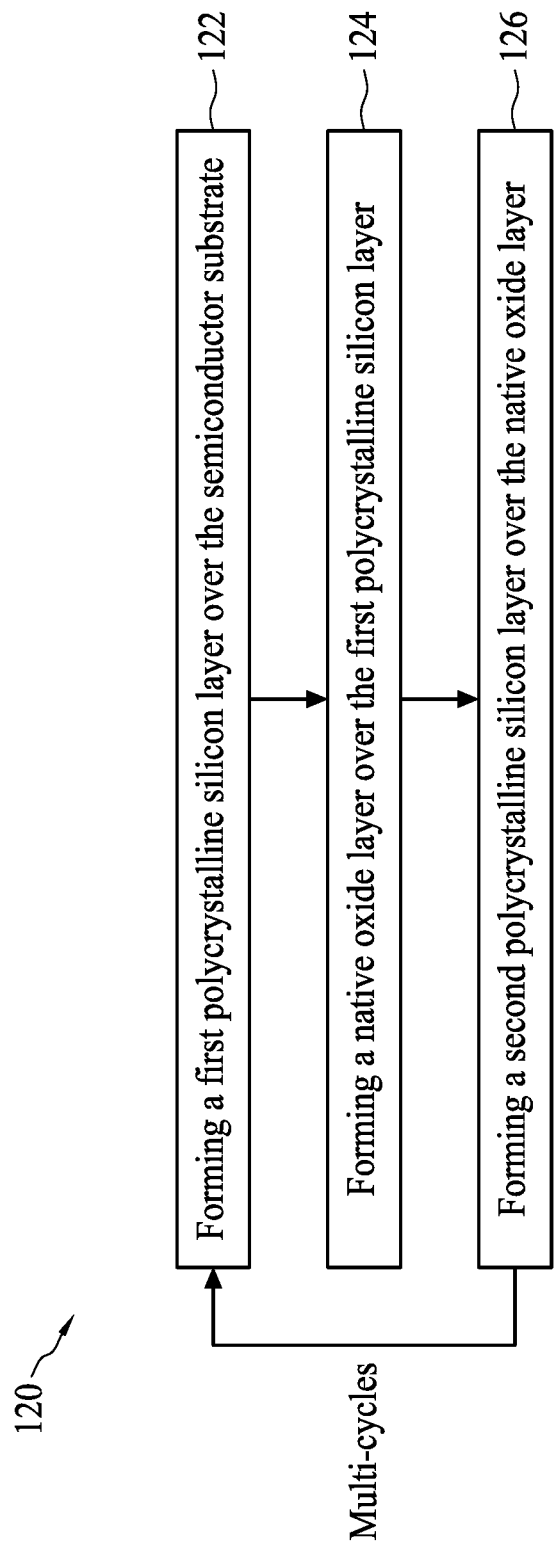
FIG. 2 is a flow chart illustrating an operation for manufacturing a multi-layered polycrystalline silicon structure according to various aspects of one or more embodiments of the present disclosure.

FIG. 2 is a flow chart illustrating an operation for manufacturing a multi-layered polycrystalline silicon structure according to various aspects of one or more embodiments of the present disclosure. The operation 120 begins with sub-operation 122 in which a first polycrystalline silicon layer is formed over the semiconductor substrate. The operation 120 proceeds with sub-operation 124 in which a native oxide layer is formed over the first polycrystalline silicon layer. The operation 120 proceeds with sub-operation 126 in which a second polycrystalline silicon layer is formed over the native oxide layer. In some embodiments, sub-operations 122, 124 and 126 may be multiply cycled to form more stacks of polycrystalline silicon layers and native oxide layers. In some embodiments, the number of the polycrystalline silicon layers is between 2 and 6, but is not limited thereto.

Figure 3A:
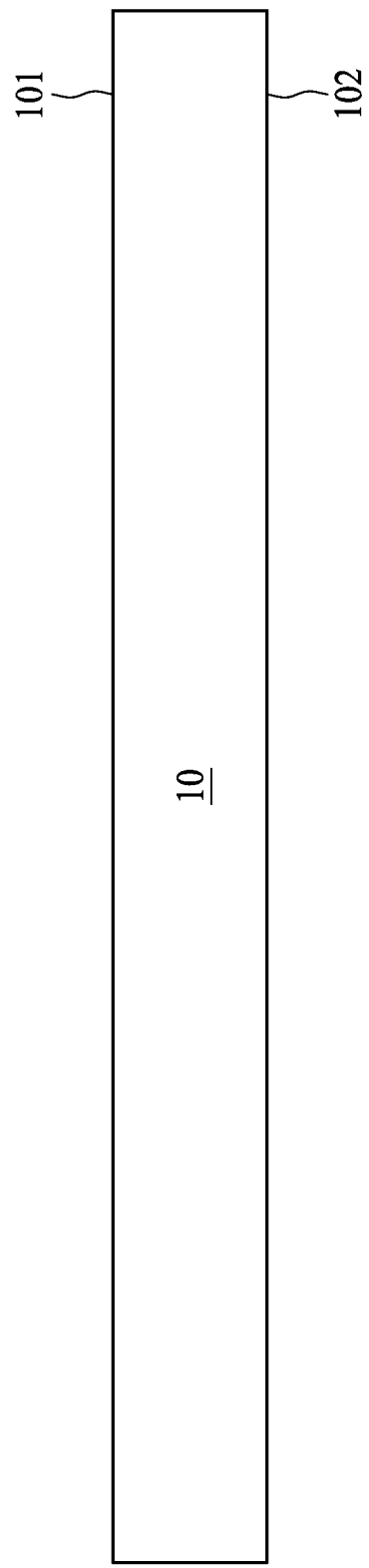
FIG. 3A, FIG. 3B, FIG. 3C, FIG. 3D, FIG. 3E, FIG. 3F and FIG. 3G are schematic views at one of various operations of manufacturing a silicon-on-insulator (SOI) substrate according to one or more embodiments of the present disclosure.

FIG. 3A, FIG. 3B, FIG. 3C, FIG. 3D, FIG. 3E, FIG. 3F and FIG. 3G are schematic views at one of various operations of manufacturing a silicon-on-insulator (SOI) substrate according to one or more embodiments of the present disclosure. As shown in FIG. 3A and operation 110 in FIG. 1, a semiconductor substrate 10 is received. The semiconductor substrate 10 has a first surface 101 and a second surface 102 opposite to the first surface 101. In some embodiments, the semiconductor substrate 10 is a handle substrate configured as a base for handling and building up overlying layers to be formed. In some embodiments, the semiconductor substrate 10 is a high resistivity handle substrate. By way of example, the semiconductor substrate 10 may have a resistivity greater than 1K Ω·cm, but is not limited thereto. In some embodiments, the semiconductor substrate 10 includes a silicon wafer such as a monocrystalline silicon substrate, but is not limited thereto. In some embodiments, the material of the semiconductor substrate 10 may include other semiconductive materials such as III-V semiconductor material, silicon carbide, silicon germanium, germanium, gallium arsenide or the like.

Figure 3B:
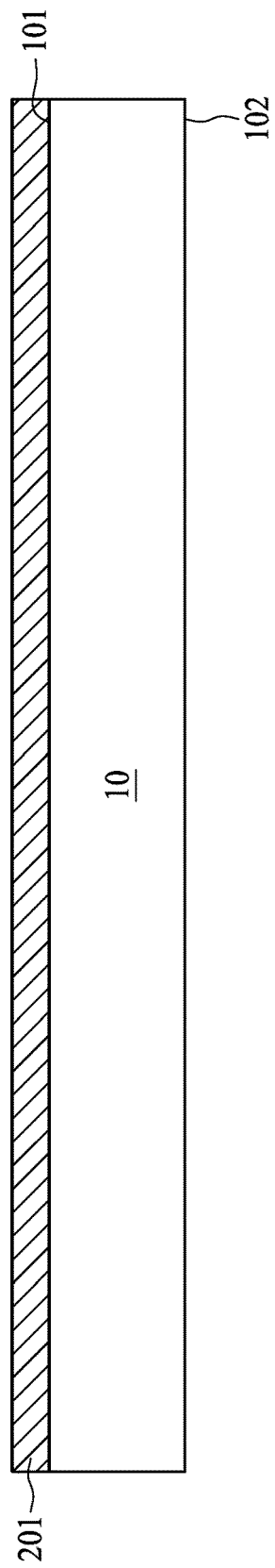

As shown in FIG. 3B and sub-operation 122 in FIG. 2, a first polycrystalline silicon layer 201 is formed over the semiconductor substrate 10. In some embodiments, the first polycrystalline silicon layer 201 is formed by a deposition operation such as a chemical vapor deposition (CVD), a low pressure chemical vapor deposition (LPCVD) or the like. In some embodiments, reaction gases such as silane ($SiH_4$) or dichlorosilane ($H_2SiCl_2$), and hydrogen ($H_2$) are introduced during the deposition operation. In some embodiments, the deposition operation for forming the first polycrystalline silicon layer 201 is performed at low temperature to prevent the grain size of the first polycrystalline silicon layer 201 from overgrowing. In some embodiments, the process temperature of the deposition operation for forming the first polycrystalline silicon layer 201 is lower than 950° C. By way of example, the process temperature of the deposition operation for forming the first polycrystalline silicon layer 201 is substantially ranging from about 600° C. to about 900° C., but is not limited thereto. In some embodiments, the grain size of the first polycrystalline silicon layer 201 is smaller than or equal to 0.1 micrometers. By way of example, the grain size of the first polycrystalline silicon layer 201 is substantially ranging from 0.03 micrometers to 0.1 micrometers, but is not limited thereto. The first polycrystalline silicon layer 201 may be configured as a trap-rich layer. In some embodiments, the first polycrystalline silicon layer 201 may include crystal defects configured to trap carriers in the semiconductor substrate 10.

In some embodiments, the first polycrystalline silicon layer 201 may be un-doped. In some embodiments, the first polycrystalline silicon layer 201 may be doped to form N-type material, P-type material, or both. In some embodiments, the first polycrystalline silicon layer 201 may be in electrical contact with the semiconductor substrate 10. In some alternative embodiments, an intervening layer that does not interfere with carrier transfer between the first polycrystalline silicon layer 201 and the semiconductor substrate 10 may exist between the first polycrystalline silicon layer 201 and the semiconductor substrate 10.

Figure 3C:
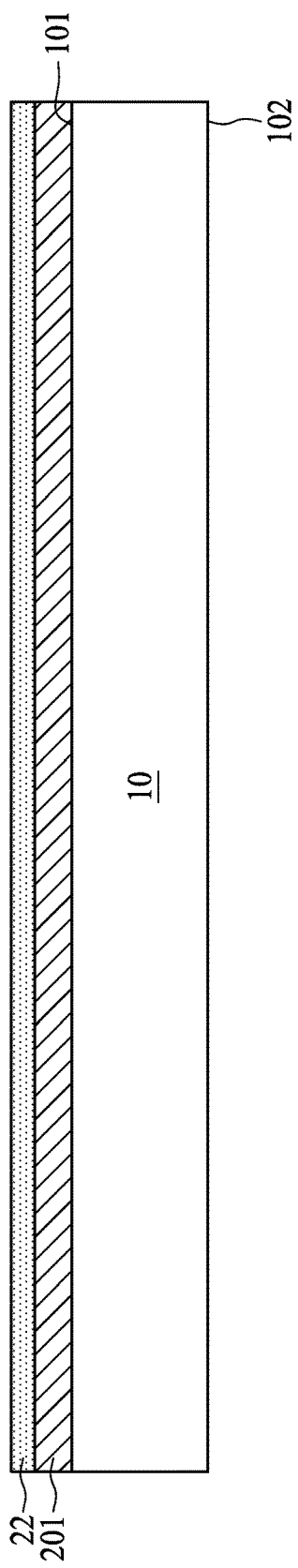

As shown in FIG. 3C and sub-operation 124 in FIG. 2, a native oxide layer 22 is formed over the first polycrystalline silicon layer 201. In some embodiments, the native oxide layer 22 may include a thermal oxide layer such as a silicon oxide layer, which may be formed by a thermal operation. In some embodiments, the native oxide layer 22 is formed by disposing the semiconductor substrate 10 in an oxygen-containing environment. In some embodiments, the native oxide layer 22 is formed by disposing the semiconductor substrate 10 in an atmospheric environment. In some embodiments, the native oxide layer 22 is formed by disposing the semiconductor substrate 10 in an inert gas environment in which inert gas such as nitrogen gas, and oxygen gas are introduced. In some embodiments, nitrogen gas and oxygen gas may be introduced at a flow rate of from about 10 ppm to about 300 ppm, but is not limited thereto. In some embodiments, the thickness of the native oxide layer 22 is substantially ranging from 0.5 nanometers to 1.5 nanometers, but is not limited thereto.

In some embodiments, the first polycrystalline silicon layer 201 and the native oxide layer 22 may be formed in an in-situ manner. By way of example, the first polycrystalline silicon layer 201 may be formed in a deposition chamber of an LPCVD apparatus, while the native oxide layer 22 may be formed in another chamber of the same LPCVD apparatus. In some embodiments, the native oxide layer 22 may be formed in a load lock chamber of the same CVD apparatus. In some embodiments, the semiconductor substrate 10 may be delivered from the deposition chamber to the load lock chamber after the first polycrystalline silicon layer 201 is formed. The load lock chamber is in a low vacuum degree lower than that of the deposition chamber, and thus some oxygen gas may remain in the load lock chamber. The oxygen gas remaining in the load lock chamber may be used as an oxidizing source to form the native oxide layer 22 at an elevated temperature. In some embodiments, the first polycrystalline silicon layer 201 and the native oxide layer 22 may be formed in an ex-situ manner. By way of example, the first polycrystalline silicon layer 201 may be formed in a deposition chamber of a CVD apparatus, while the native oxide layer 22 may be formed in another chamber of another manufacturing apparatus. In some embodiments, oxygen gas and other inert gas such as nitrogen gas may be introduced to the chamber to form the native oxide layer 22.

Figure 3D:
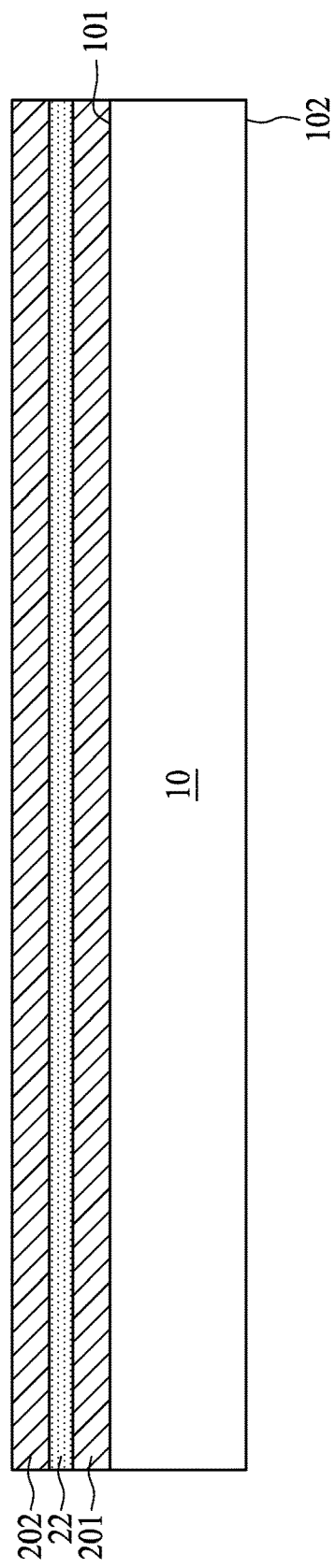

As shown in FIG. 3D and sub-operation 126 in FIG. 2, a second polycrystalline silicon layer 202 is formed over the native oxide layer 22. In some embodiments, the second polycrystalline silicon layer 202 is formed by a deposition operation such as a chemical vapor deposition (CVD), a low pressure chemical vapor deposition (LPCVD) or the like. In some embodiments, a reaction gas such as silane ($SiH_4$) or dichlorosilane ($H_2SiCl_2$), and hydrogen ($H_2$) are introduced during the deposition operation. In some embodiments, the deposition operation for forming the second polycrystalline silicon layer 202 is performed at low temperature to prevent the grain size of the second polycrystalline silicon layer 202 from growing. In some embodiments, the process temperature of the deposition operation for forming the second polycrystalline silicon layer 202 is lower than 950° C. By way of example, the process temperature of the deposition operation for forming the second polycrystalline silicon layer 202 is substantially ranging from about 600° C. to about 900° C., but is not limited thereto. In some embodiments, the grain size of the second polycrystalline silicon layer 202 is smaller than or equal to 0.1 micrometers. By way of example, the grain size of the second polycrystalline silicon layer 202 is substantially ranging from 0.03 micrometers to 0.1 micrometers, but is not limited thereto. The second polycrystalline silicon layer 202 may be configured as a trap-rich layer. In some embodiments, the second polycrystalline silicon layer 202 may include crystal defects configured to trap carriers in the semiconductor substrate 10.

In some embodiments, the second polycrystalline silicon layer 202 may be un-doped. In some embodiments, the second polycrystalline silicon layer 202 may be doped to form N-type material, P-type material, or both.

In some embodiments, the native oxide layer 22 interposed between the first polycrystalline silicon layer 201 and the the second polycrystalline silicon layer 202 may be configured as a barrier layer or a block layer. The native oxide layer 22 may block the grains of the first polycrystalline silicon layer 201 and the the second polycrystalline silicon layer 202 from abutting each other, and thus may help to inhibit regrowth of the grains. The grains of the first polycrystalline silicon layer 201 and the second polycrystalline silicon layer 202 may be controlled to have smaller grain size, finer structure and high trap density.

Figure 3E:
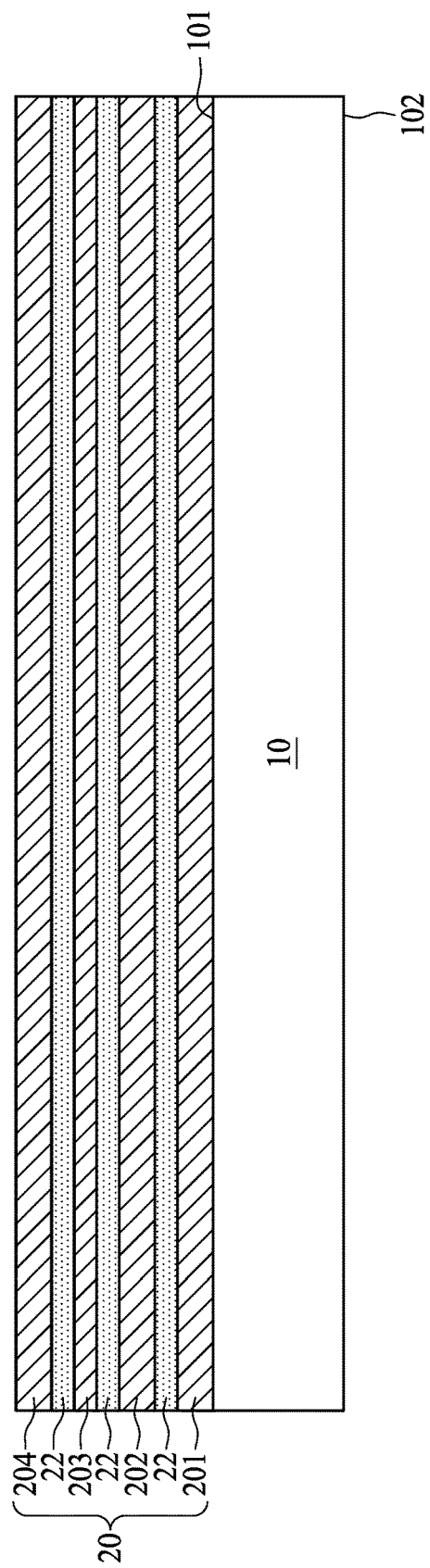

As shown in FIG. 3E and operation 120 in FIG. 2, sub-operations 122, 124 and 126 may be multiply cycled to form another one or more polycrystalline silicon layer and native oxide layer to form a multi-layered polycrystalline silicon structure 20 over the semiconductor substrate 10. In some embodiments, the multi-layered polycrystalline silicon structure 20 may include four polycrystalline silicon layers and three native oxide layers 22 interposed between each adjacent pair of polycrystalline silicon layers. For example, a third polycrystalline silicon layer 203 and a fourth polycrystalline silicon layer 204 are subsequently formed over the second polycrystalline silicon layer 202. Native oxide layers 22 are formed in between each adjacent pair of the polycrystalline silicon layers. In some embodiments, the third polycrystalline silicon layer 203 and the fourth polycrystalline silicon layer 204 may be formed by similar operation as the first polycrystalline silicon layer 201 and the the second polycrystalline silicon layer 202. The third polycrystalline silicon layer 203 and the fourth polycrystalline silicon layer 204 may have similar characteristics as the first polycrystalline silicon layer 201 and the the second polycrystalline silicon layer 202. In some embodiments, the additional native oxide layer 22 may be formed by similar operation as the native oxide layer 22. In some embodiments, the grain size of the third polycrystalline silicon layer 203 or the fourth polycrystalline silicon layer 204 may be smaller than or equal to 0.1 micrometers. For example, the grain size of the third polycrystalline silicon layer 203 or the fourth polycrystalline silicon layer 204 may be substantially ranging from 0.03 micrometers to 0.1 micrometers, but is not limited thereto. In some embodiments, the thickness of the multi-layered polycrystalline silicon structure 20 is smaller than or equal to 3 micrometers. By way of example, the thickness of the multi-layered polycrystalline silicon structure 20 is substantially ranging from 0.6 micrometers to 3 micrometers, but is not limited thereto. In some embodiments, the number of the polycrystalline silicon layers of the multi-layered polycrystalline silicon structure 20 is between 2 and 6, but is not limited thereto. In some embodiments, the number of the polycrystalline silicon layers of the multi-layered polycrystalline silicon structure 20 may be more than 6. In some embodiments, the thickness of the polycrystalline silicon layers of the multi-layered polycrystalline silicon structure 20 is configured to inhibit the growth of the grains. For example, the thickness of each polycrystalline silicon layers of the multi-layered polycrystalline silicon structure 20 is substantially ranging from about 0.1 micrometers to about 1.5 micrometers, but is not limited thereto.

In some embodiments, a planarization operation such as a chemical mechanical polishing (CMP) operation may be performed upon the multi-layered polycrystalline silicon structure 20 to planarize the surface of the multi-layered polycrystalline silicon structure 20.

Figure 3F:
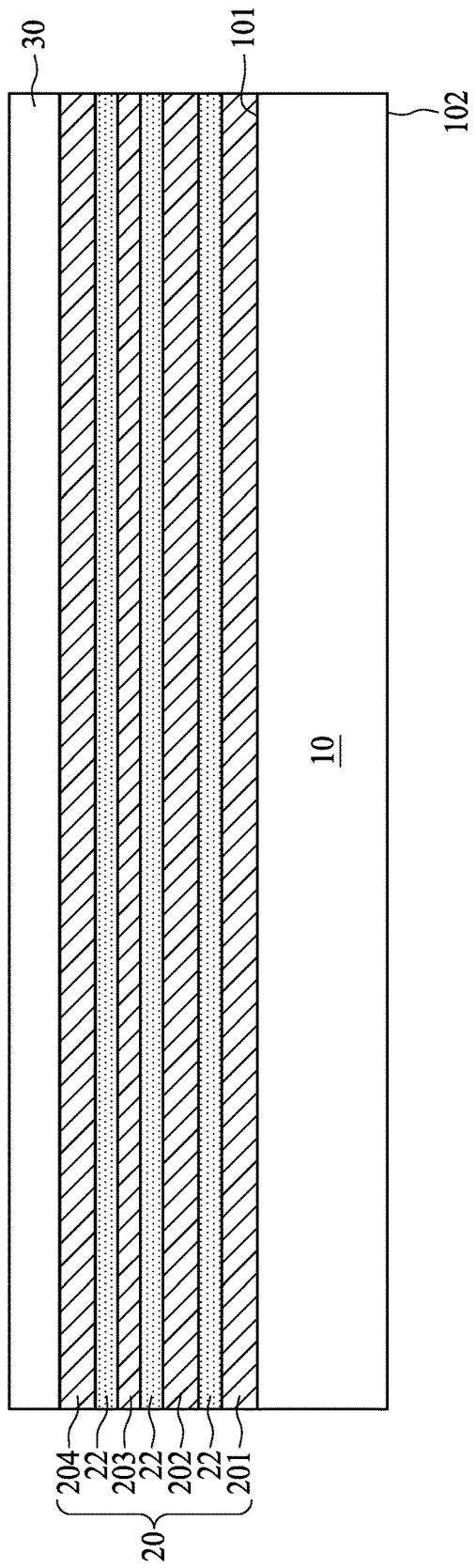

As shown in FIG. 3F and operation 130 in FIG. 1, a buried oxide layer 30 is formed over the multi-layered polycrystalline silicon structure 20. In some embodiments, the buried oxide layer 30 is buried silicon oxide layer such as a thermal silicon oxide layer. In some embodiments, the buried oxide layer 30 may be formed by oxidization in a furnace, or by other suitable oxidization operations. In some embodiments, the buried oxide layer 30 may be configured as an insulative layer. The buried oxide layer 30 electrically isolates an active semiconductor layer to be formed from the semiconductor substrate 10. In some embodiments, a planarization operation such as a CMP operation may be performed upon the buried oxide layer 30 to planarize the surface of the buried oxide layer 30.

Figure 3G:
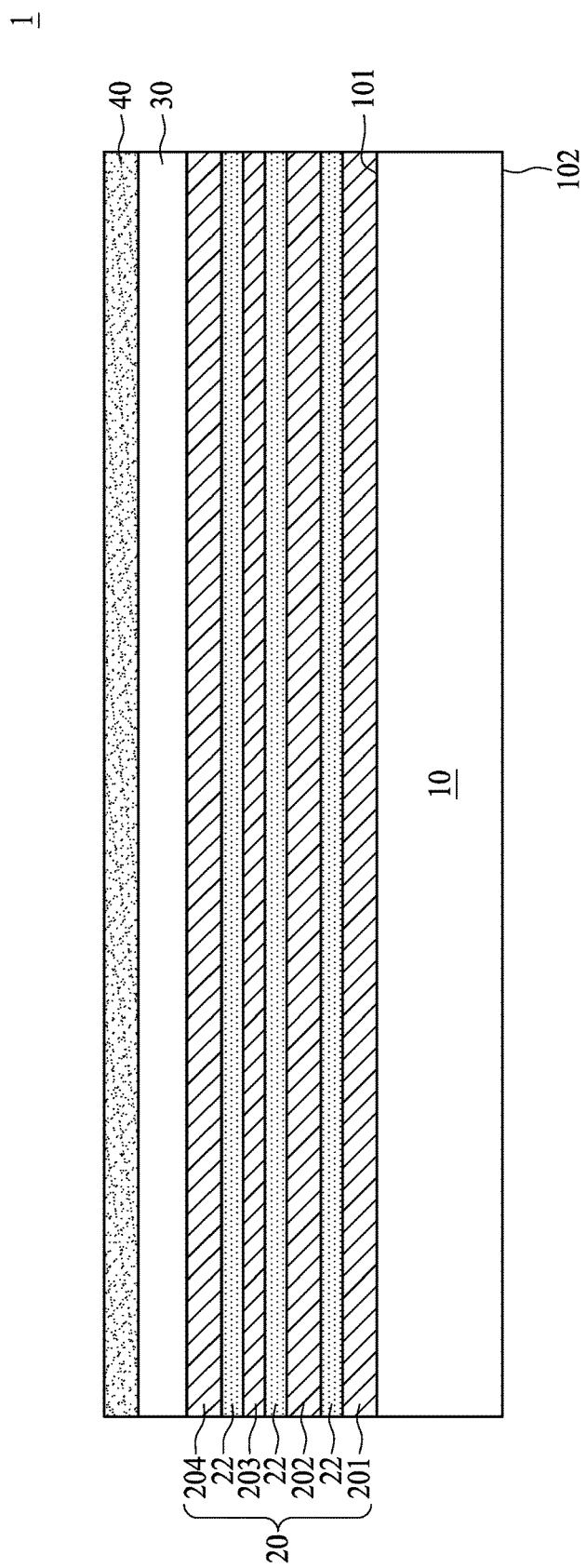

As shown in FIG. 3G and operation 130 in FIG. 1, an active layer 40 may be formed over the buried oxide layer 30 to form an SOI substrate 1. In some embodiments, the active layer 40 may include an active semiconductor such as a superficial silicon layer or other semiconductor layers, but not limited thereto. In some embodiments, the active layer 40 may be formed by bonding a semiconductor wafer such as a silicon wafer to the buried oxide layer 30. In some embodiments, the semiconductor wafer may be thinned to a suitable thickness by e.g., grinding or polishing. In some embodiments, the active layer 40 may be configured as an active region for manufacturing a semiconductor component such as a passive device and/or an active device. In some embodiments, the semiconductor component may include a radio frequency (RF) device.

In some embodiments of the present disclosure, the multi-layered polycrystalline silicon structure 20 is configured as a multi-layered trap-rich structure. The polycrystalline silicon layers of the multi-layered polycrystalline silicon structure 20 include crystal defects having dislocations. The crystal defects are configured to trap carriers in the semiconductor substrate 10 and/or in the buried oxide layer 30. By trapping the carriers within the crystal defects of the multi-layered polycrystalline silicon structure 20, parasitic surface conduction which may result in non-linear distortion to RF signals may be mitigated. During fabrication of devices such as RF switch, the SOI substrate 1 may undergo some anneal operations or experience high temperature. The native oxide layer 22 of the multi-layered polycrystalline silicon structure 20 is configured to block the grains of the polycrystalline silicon layers from abutting each other, and thus may help to inhibit regrowth of the grains during anneal operations or at high temperature. By virtue of the native oxide layer 22, the grains of the polycrystalline silicon layers may be controlled to have smaller grain size and fine grain structure, and thus the trap density of the multi-layered polycrystalline silicon structure 20 can be increased.

The silicon-on-insulator (SOI) substrate and semiconductor device of the present disclosure is not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 4:
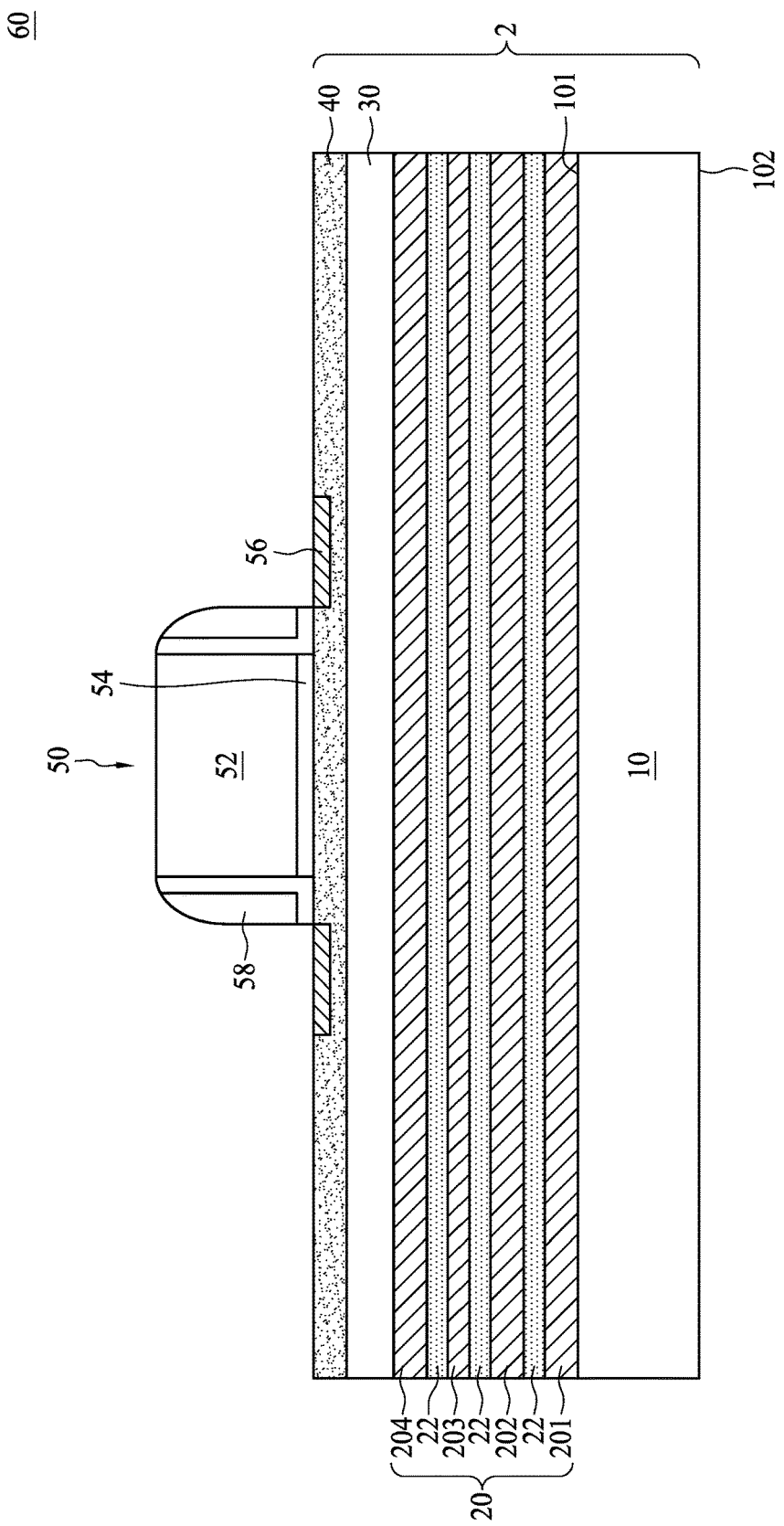
FIG. 4 is a schematic view of a semiconductor device according to some embodiments of the present disclosure.

FIG. 4 is a schematic view of a semiconductor device according to some embodiments of the present disclosure. As shown in FIG. 4, the semiconductor device 60 may include a silicon-on-insulator (SOI) substrate 2 and a semiconductor component 50. In some embodiments, the SOI substrate 2 may be similar to the SOI substrate 1 as illustrated in FIG. 3G. The semiconductor component 50 is disposed over the SOI substrate 2. In some embodiments, the semiconductor component 50 may include an RF transistor or the like. In some embodiments, the semiconductor component 50 may include a gate electrode 52, a gate insulation layer 54, source/drain regions 56 and spacer structures 58. The gate electrode 52 may be disposed over the active layer 40. The gate insulation layer 54 may be disposed between the gate electrode 52 and the active layer 40. The source/drain regions 56 may be formed in the active layer 40 at opposite sides of the gate electrode 52. The spacer structures 58 may be disposed on opposite sides of the gate electrode 52. In some alternative embodiments, the semiconductor component 50 may include an RF device such as an RF switch or the like.

If the period of an RF signal is shorter than a majority carrier relaxation time, then the majority carriers in semiconductor substrate 10 may not respond to the RF signal. The majority carriers may appear to be frozen and the semiconductor substrate 10 may behave as a dielectric. However, silicon has certain characteristics that may produce undesirable behavior in some RF applications. For example, the doping level in the high resistivity semiconductor substrate 10 is very low or non-existent. Therefore, oxide charges at the surface of the semiconductor substrate 10, or a weak electric field in the semiconductor substrate 10 can induce an inversion or accumulation layer, which may function as a surface conduction layer at the surface of the semiconductor substrate 10. RF signals traversing above the surface of the semiconductor substrate 10 may modulate the surface conduction layer, which may cause non-linear capacitance, non-linear conductance, or both affecting RF interactions between the semiconductor substrate 10 and other overlying layers. The non-linear characteristics may introduce harmonic distortion in the RF signals, which may exceed allowable limits. The multi-layered polycrystalline silicon structure 20 may be configured as a multi-layered trap-rich structure. The polycrystalline silicon layers of the multi-layered polycrystalline silicon structure 20 include crystal defects having dislocations. The crystal defects are configured to trap carriers in the semiconductor substrate 10 and/or in the buried oxide layer 30. By trapping the carriers within the crystal defects of the multi-layered polycrystalline silicon structure 20, parasitic surface conduction which may result in non-linear distortion to RF signals may be mitigated. In some embodiments, the SOI substrate 2 may undergo some anneal operations or experience high temperature. The native oxide layer 22 of the multi-layered polycrystalline silicon structure 20 is configured to block the grains of the polycrystalline silicon layers from abutting each other, and thus may help to inhibit regrowth of the grains during anneal operations or at high temperature. By virtue of the native oxide layer 22, the grains of the polycrystalline silicon layers may be controlled to have smaller grain size and fine grain structure, and thus the trap density of the multi-layered polycrystalline silicon structure 20 can be increased.

In some embodiments of the present disclosure, the multi-layered polycrystalline silicon structure of the SOI substrate may be configured as a multi-layered trap-rich structure that may substantially immobilize a surface conduction layer at the surface of the semiconductor substrate at radio frequency (RF) frequencies. The multi-layered trap-rich structure may have a high density of traps that trap carriers from the surface conduction layer. The average release time from the traps may be longer than the period of RF signals, thereby effectively immobilizing the surface conduction layer, which may substantially prevent capacitance and inductance changes due to the RF signals. Therefore, harmonic distortion of the RF signals may be reduced or alleviated. The native oxide layer may be configured as a barrier layer that may block the grains of the trap-rich layers from abutting each other. The barrier layer thus may help to inhibit regrowth of the grains of the polycrystalline silicon, and increase trap density of the multi-layered trap-rich structure.

In one exemplary aspect, a silicon-on-insulator (SOI) substrate includes a semiconductor substrate and a multi-layered polycrystalline silicon structure. The multi-layered polycrystalline silicon structure is disposed over the semiconductor substrate. The multi-layered polycrystalline silicon structure includes a plurality of polycrystalline silicon layers stacked over one another, and a native oxide layer between each adjacent pair of polycrystalline silicon layers.

In another aspect, a semiconductor device includes a silicon-on-insulator (SOI) substrate and a semiconductor component over the SOI substrate. The SOI substrate includes a high resistivity handle substrate, a multi-layered trap-rich structure and an insulative layer. The multi-layered trap-rich structure is over the high resistivity handle substrate. The multi-layered trap-rich structure includes a plurality of trap-rich layers stacked over one another, and one or more barrier layer between each adjacent pair of trap-rich layers. The insulative layer is over the multi-layered trap-rich structure.

In yet another aspect, a method for manufacturing a silicon-on-insulator (SOI) substrate includes the following operations. A semiconductor substrate is received. A multi-layered polycrystalline silicon structure is formed over the semiconductor substrate. The multi-layered polycrystalline silicon structure includes a plurality of polycrystalline silicon layers stacked over one another, and a native oxide layer between each adjacent pair of polycrystalline silicon layers. A buried oxide layer and an active layer are formed over the multi-layered polycrystalline silicon structure.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A silicon-on-insulator (SOI) substrate, comprising:
a semiconductor substrate; and
a multi-layered polycrystalline silicon structure over the semiconductor substrate, the multi-layered polycrystalline silicon structure comprising:
a plurality of polycrystalline silicon layers stacked over one another, wherein the plurality of polycrystalline silicon layers comprises N-type or P-type doped polycrystalline silicon layers; and
a native oxide layer between each adjacent pair of the plurality of polycrystalline silicon layers.

2. The SOI substrate of claim 1, further comprising a buried oxide layer over the multi-layered polycrystalline silicon structure.

3. The SOI substrate of claim 2, further comprising a superficial silicon layer over the buried oxide layer.

4. The SOT substrate of claim 1, wherein a number of the polycrystalline silicon layers is ranging from 2 to 6.

5. The SOI substrate of claim 1, wherein a grain size of each of the polycrystalline silicon layers is smaller than or equal to 0.1 micrometers.

6. The SOI substrate of claim 5, wherein the grain size of each of the polycrystalline silicon layers is substantially ranging from 0.03 micrometers to 0.1 micrometers.

7. The SOI substrate of claim 1, wherein a thickness of the multi-layered polycrystalline silicon structure is smaller than or equal to 3 micrometers.

8. The SOI substrate of claim 7, wherein the thickness of the multi-layered polycrystalline silicon structure is substantially ranging from 0.6 micrometers to 3 micrometers.

9. The SOI substrate of claim 1, wherein a thickness of the one or more native oxide layer is substantially ranging from 0.5 nanometers to 1.5 nanometers.

10. A semiconductor device, comprising:
a silicon-on-insulator (SOI) substrate, comprising:
a high resistivity handle substrate;
a multi-layered trap-rich structure over the high resistivity handle substrate, the multi-layered trap-rich structure comprising:
a plurality of trap-rich layers stacked over one another, wherein the plurality of trap-rich layers are doped not with carbon; and
a barrier layer between each adjacent pair of the plurality of trap-rich layers;
an insulative layer over the multi-layered trap-rich structure; and
a semiconductor component over the SOI substrate.

11. The semiconductor device of claim 10, wherein a number of the trap-rich layers is ranging from 2 to 6.

12. The semiconductor device of claim 10, wherein each of the plurality of trap-rich layers comprise a polycrystalline silicon layer.

13. The semiconductor device of claim 10, wherein a grain size of each of the trap-rich layers is substantially ranging from 0.03 micrometers to 0.1 micrometers.

14. The semiconductor device of claim 10, wherein a thickness of the multi-layered trap-rich structure is substantially ranging from 0.6 micrometers to 3 micrometers.

15. The semiconductor device of claim 10, wherein the one or more barrier layer comprises a native oxide layer.

16. The semiconductor device of claim 10, wherein a thickness of the one or more barrier layer is substantially ranging from 0.5 nanometers to 1.5 nanometers.

17. A method for manufacturing a silicon-on-insulator (SOI) substrate, comprising:
receiving a semiconductor substrate;
forming a multi-layered polycrystalline silicon structure over the semiconductor substrate, wherein the multi-layered polycrystalline silicon structure comprises:
a plurality of polycrystalline silicon layers stacked over one another, wherein the plurality of polycrystalline silicon layers comprises N-type or P-type doped polycrystalline silicon layers; and
a native oxide layer between each adjacent pair of the plurality of polycrystalline silicon layers; and
forming a buried oxide layer and an active layer over the multi-layered polycrystalline silicon structure.

18. The method of claim 17, wherein the native oxide layer is formed by disposing the semiconductor substrate in an oxygen-containing environment.

19. The method of claim 17, wherein a grain size of each of the polycrystalline silicon layers is substantially ranging from 0.03 micrometers to 0.1 micrometers.

20. The method of claim 17, wherein a grain regrowth of the polycrystalline silicon layers is inhibited by the native oxide layer.

* * * * *